United States Patent

Sato et al.

Patent Number: 5,826,778
Date of Patent: Oct. 27, 1998

[54] CLAMPING MECHANISM FOR A BONDING APPARATUS

[75] Inventors: Koji Sato, Akishima; Junichi Ide, Fuchu; Yukitaka Sonoda, Tachikawa, all of Japan

[73] Assignee: Kabushiki Kaisha Shinkawa, Tokyo, Japan

[21] Appl. No.: 754,978

[22] Filed: Nov. 22, 1996

[30] Foreign Application Priority Data

Nov. 24, 1995  [JP]  Japan ................................ 7-329521

[51] Int. Cl.$^6$ ............................................ H01L 21/60
[52] U.S. Cl. ........................ 228/44.7; 228/212; 269/164
[58] Field of Search ................. 228/4.5, 44.7, 228/212, 180.5; 269/152, 155, 164

[56] References Cited

U.S. PATENT DOCUMENTS

| | | | |
|---|---|---|---|
| 5,080,279 | 1/1992 | Davison | 228/212 |
| 5,249,726 | 10/1993 | Sato | 228/44.7 |
| 5,307,978 | 5/1994 | Ricketson et al. | 228/4.5 |

*Primary Examiner*—Samuel M. Heinrich
*Attorney, Agent, or Firm*—Koda & Androlia

[57] ABSTRACT

A bonding apparatus provided with a clamping device for holding a workpiece such as a tab tape, comprising an upper clamper and a lower clamper which are respectively divided into two sections. The upper and lower clampers are respectively mounted on an upper clamper holding plate and a lower clamper holding plate so that the gaps between facing surfaces of the respective sections of the clampers can be adjusted.

5 Claims, 4 Drawing Sheets

CLAMPING MECHANISM FOR A BONDING APPARATUS

BACKGROUND OF THE INVENTION

1. Field of the Invention

The present invention relates to a clamping mechanism for a bonding apparatus.

2. Prior Art

A conventional tape bonding apparatus which bonds semiconductor pellets or individual bumps, etc., to a tab tape, is provided with a tape clamping mechanism which clamps the tab tape between an upper clamper and a lower clamper in the bonding position.

Japanese Patent Application Kokai No. 5-21532 discloses a tape clamping mechanism of this type.

Furthermore, in a die bonding apparatus which bonds semiconductor pellets to lead frames, or a wire bonding apparatus which bonds wires between the leads of lead frames to which semiconductor pellets are attached and pads on the semiconductor pellets, a clamper is provided so as to press the lead frames against a heating block.

A device of this type is disclosed in Japanese Patent Application Kokoku No. 6-69050.

The clamping mechanism for a tape bonding apparatus disclosed in the Japanese Patent Application Kokai No. 5-21532 will be described as one example with reference to FIGS. 7 through 9.

In this clamping mechanism, an upper clamper 2 is fastened by screws 3 to an upper clamper holding plate 1 which is driven parallel to the vertical direction by a driving means (not shown), and a bonding window 2a is formed in the upper clamper 2. Furthermore, a lower clamper 5 is fastened by screws 6 to a lower clamper holding plate 4 which is driven horizontally in the vertical direction by a driving means (not shown), and a bonding window 5a is formed in the lower clamper 5 so as to positionally correspond to the bonding window 2a of the upper clamper 2.

A bonding tool 10 which is driven in the vertical direction and in the X and Y directions by a driving means (not shown) is installed above the bonding window 2a of the upper clamper 2. Furthermore, a bonding stage 11 which is driven in the vertical direction and in the θ direction (in other words, the stage 11 is horizontally rotatable) by a driving means (not shown) is installed beneath the bonding window 5a of the lower clamper 5, and a semiconductor pellet (not shown) is positioned and held in place on the upper surface of the bonding stage 11. Moreover, as shown in FIG. 6, lead parts 12a are installed on a tab tape 12. The reference numeral 13 indicated by a one-dot chain line indicates a clamping area that is clamped by the upper clamper 2 and lower clamper 5.

In operation, the tab tape 12 is fed with the upper clamper 2 and lower clamper 5 in a separated state, that is, with the upper clamper 2 in its upper position and the lower clamper 5 in its lower position. One of the lead parts 12a of the tab tape 12 is fed into the area of the bonding windows 2 and 5 and is positioned in such area; and in addition, the position of the lead part 12a and the position of the semiconductor pellet positioned and held on the surface of the bonding stage 11 are aligned. Next, the lower clamper holding plate 4 is raised so that the lower clamper 5 rises to the conveying level of the tab tape 12, the upper clamper holding plate 1 is then lowered so that the upper clamper 2 presses the tab tape 12 against the lower clamper 5. As a result, the tab tape 12 is clamped between the upper clamper 2 and the lower clamper 5.

Next, the bonding stage 11 is moved upward so that the semiconductor pellet positioned on the surface of the bonding stage 11 is caused to approach the lead part 12a of the tab tape 12. Then, the bonding tool 10 is lowered so as to press the lead part 12a of the tab tape 12 against the pellet, thus the semiconductor pellet is bonded to the tab tape 12, after which the bonding tool 10 is moved upward. Following the completion of bonding, the upper clamper holding plate 1 is raised so that the upper clamper 2 is withdrawn. Next, the lower clamper holding plate 4 is lowered so that the lower clamper 5 is withdrawn. The tab tape 12 is fed in this state so that the next lead part 12a that is to be bonded is positioned in the bonding windows 2a and 5a.

In this way, a series of operations is completed. This process is repeated so that semiconductor pellets are successively bonded to the tab tape 12.

Generally, semiconductor pellets are either square or rectangular, or have dimensions close to one of these shapes. Accordingly, as shown in FIG. 6, the clamping area 13 of the lead patterns of the lead parts 12a of the tab tape 12 and the bonding windows 2a and 5a in the upper and lower clampers 2 and 5 are formed so that the clamping area and bonding windows have the same shape as the semiconductor pellets. Furthermore, the dimensions of the bonding windows 2a and 5a are determined by the type of product to be handled. Accordingly, when the type of product to be handled is changed, it is necessary to replace the upper clamper 2 and lower clamper 5 with an upper clamper and lower clamper that are suited to the new product type.

In recent years, semiconductor devices have become significantly slimmer as seen in the LCD modules, etc.; as a result, the short-side dimensions of such semiconductor devices have been reduced to, for instance, approximately 1 mm, and the ratio of the short sides to the long sides of such semiconductor devices has been in the range of 1:10 to 1:20. Accordingly, as is shown in FIG. 5, the clamping areas 13 of the lead patterns of the lead parts 12a of tab tapes 12 have extremely small short-side dimensions.

SUMMARY OF THE INVENTION

Accordingly, the object of the present invention is to provide a clamping mechanism for a bonding apparatus where there is no need to change the clampers for each type of product to be handled even when tab tapes or lead frames with lead patterns have small short-side dimensions.

The object is accomplished by a unique structure for a tape bonding apparatus in which a tab tape is clamped from above and below by an upper clamper and a lower clamper, wherein the upper clamper and lower clamper are respectively split into two parts on the short sides of lead patterns formed on the tab tape and are respectively fastened to an upper clamper holding plate and a lower clamper holding plate so that the gaps between the facing surfaces of the two parts of the respective clamper are adjustable.

The object is accomplished by another unique structure for a die bonding apparatus or wire bonding apparatus in which lead frames are pressed against a heating block by a clamper, wherein the clamper is split into two parts on the short sides of lead patterns formed on the lead frames and is fastened to a clamper holding plate so that the gap between the facing surfaces of the two parts of the respective clamper is adjustable.

As described above, in the tape bonding apparatus, the upper clamper and lower clamper which clamp a tab tape from above and below are respectively split into two parts on the short sides of lead patterns formed on the tab tape and are respectively fastened to an upper clamper holding plate and a lower clamper holding plate so that the gaps between the facing surfaces of the two split parts of each clamper can be adjusted. Accordingly, the gaps between the facing surfaces of the respective parts of the upper and lower clampers are adjusted each time there is a change in the type of product to be handled in the case of tab tapes which have lead patterns with small short-side dimensions. Thus, there is no need to change the clampers.

In die bonding apparatuses and wire bonding apparatuses, lead frames are pressed against a heating block by a clamper. Accordingly, the present invention can be applied to such bonding apparatuses by constructing the clamper and clamper holding plate thereof in the same manner as the upper clamper and upper clamper holding plate used in the tape bonding apparatus described above.

DETAILED DESCRIPTION OF THE PREFERRED EMBODIMENTS

One embodiment of the present invention will be described with reference to FIGS. 1 through 5.

Figure 1:
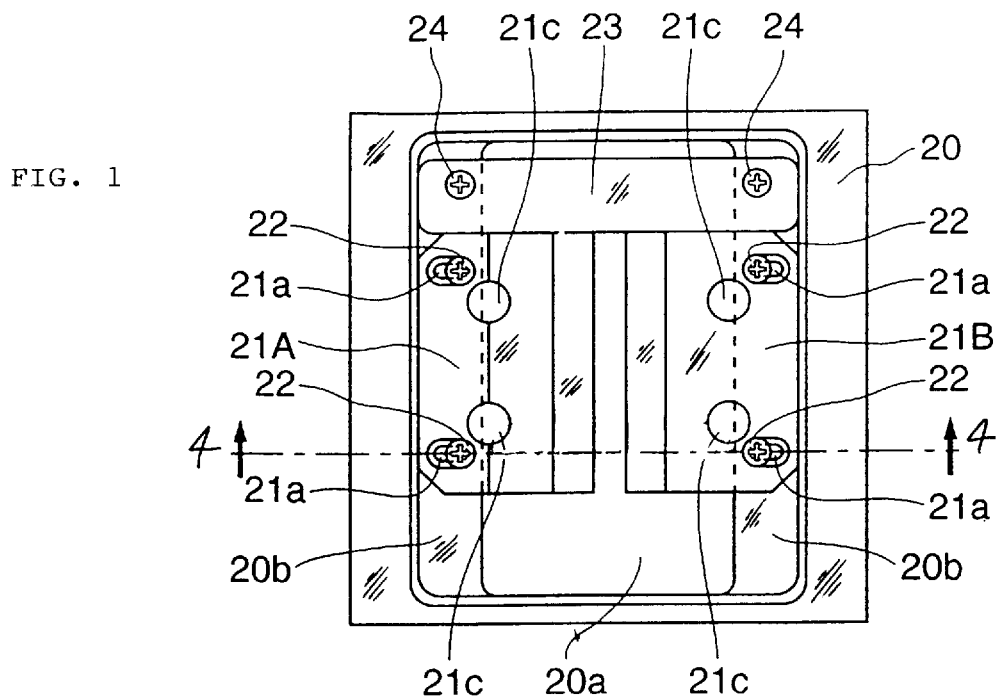
FIG. 1 is a top view of one embodiment of the clamping mechanism for a bonding apparatus according to the present invention.
Figure 3:
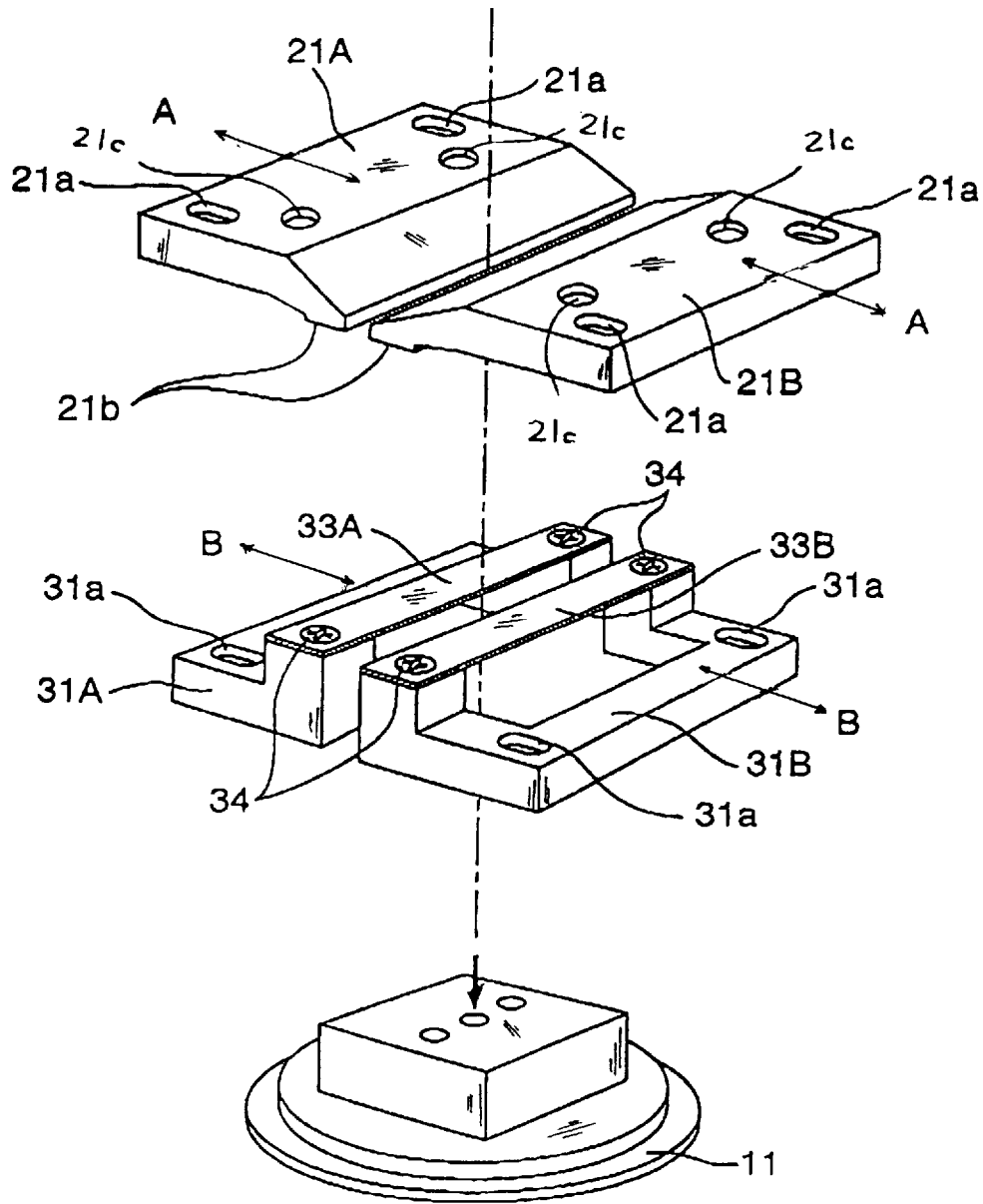
FIG. 3 is a perspective view showing the upper clamper, the lower clamper and a bonding stage of the bonding apparatus.
Figure 4:
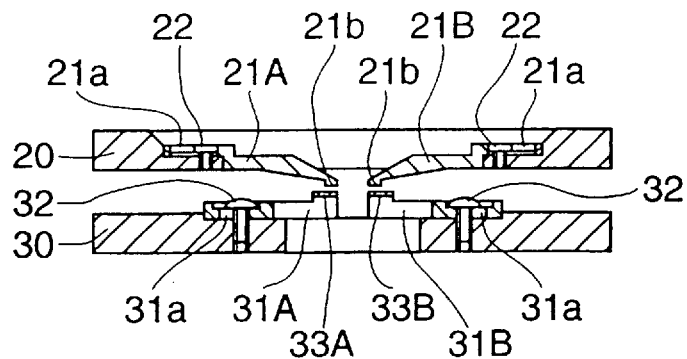
FIG. 4 is a sectional view taken along the line 4—4 of FIG. 1.
Figure 5:
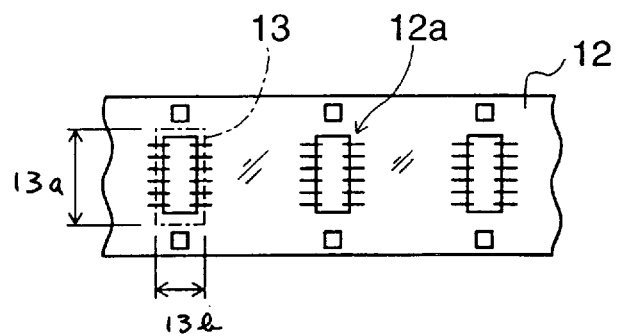
FIG. 5 illustrates one example of a tab tape to be bonded.
Figure 6:
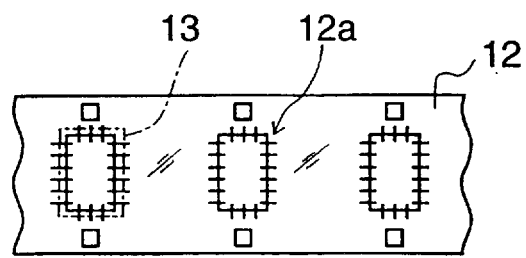
FIG. 6 illustrates another example of a tab tape to be bonded.
Figure 7:
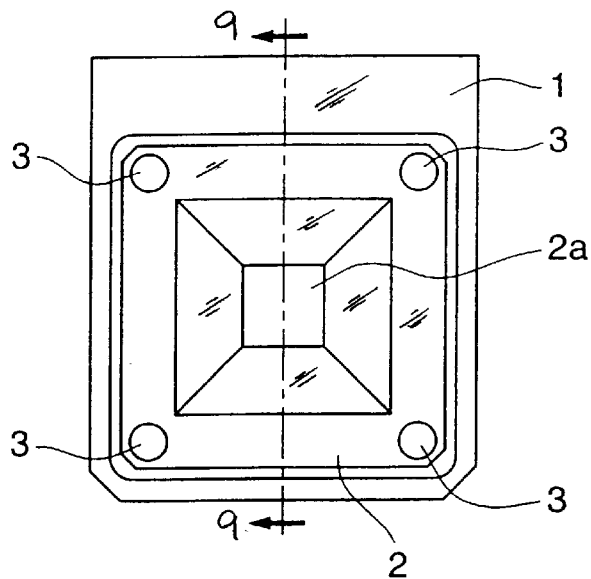
FIG. 7 is a top view of a conventional clamping mechanism of a bonding apparatus.
Figure 8:
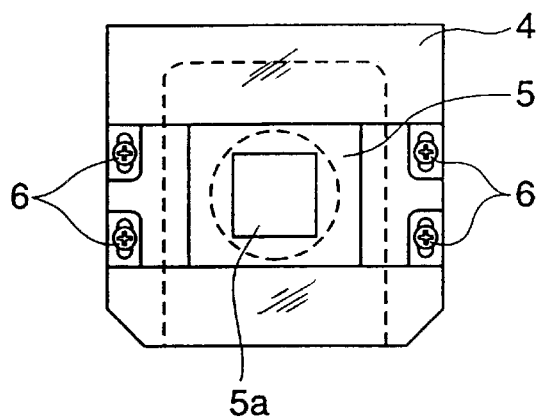
FIG. 8 is a top view of the lower clamper thereof.
Figure 9:
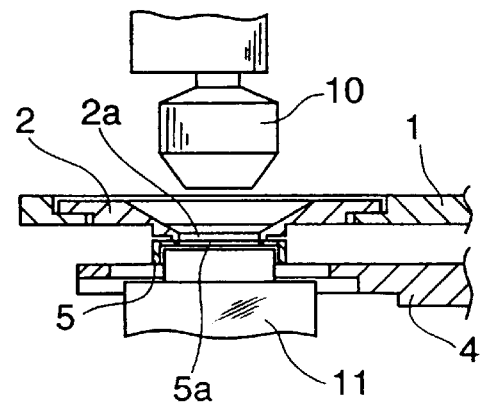
FIG. 9 is a sectional view taken along the line 9—9 in FIG. 7.

As shown in FIGS. 1, 3 and 4, an upper clamper holding plate 20 which is driven parallel to the vertical direction by a driving means (not shown) is provided with a central cut-out area 20a, and upper clamper carrying parts 20b are formed on both sides of the central cut-out part 20a. Respective upper clamper members 21A and 21B are fastened by screws 22 to the upper clamper carrying parts 20b so as to be positioned on both sides of the central cut-out area 20a. Screw insertion holes 21a are opened in the upper clamper members 21A and 21B. The screw insertion holes 21a are formed as slots which extend in the direction parallel to short sides 13b of a clamping area 13 of each lead part 12a formed on the tab tape 12 which is clamped or held by the upper clamping members 21A and 21B. The upper clamper members 21A and 21B are formed symmetrically, and retaining parts 21b which clamp or hold long-side 13a of the clamping area 13 of each lead part 12a of the tab tape 12 are formed on the undersurfaces of the respective facing parts of the upper clamper members 21A and 21B. Furthermore, a guide plate 23 which is for guiding the upper clamper members 21A and 21B is fastened by screws 24 to the upper clamper carrying parts 20b so as to be located on one side of the upper clamper members 21A and 21B.

More specifically, the pair of symmetric clamper members 21A and 21B comprises an upper clamper, and the retaining parts 21a and 21b of the clamper members 21A and 21B extend in the direction parallel to the long sides 13a (or perpendicular to the short sides 13b) of the clamping area 13 formed on the tab tape 12. Thus when this upper clamper of the present invention is compared to the prior art lower clamper, it can be said that the upper clamper of the present invention comprises two split parts that work together to clamp or hold a tab tape.

Figure 2:
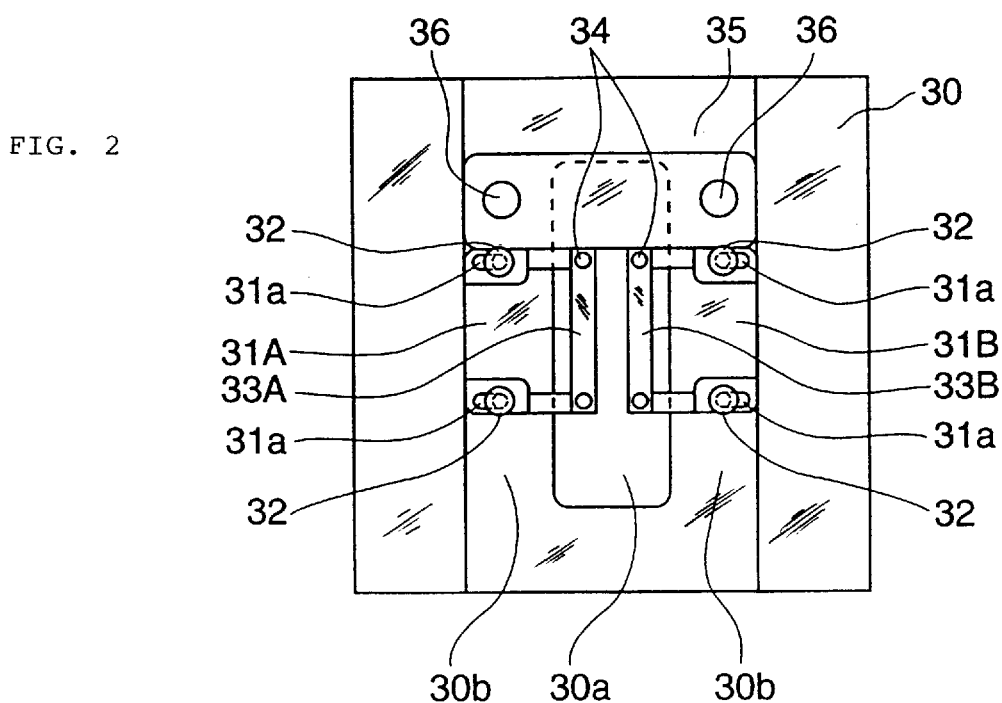
FIG. 2 is a top view of the lower clamper thereof.

As seen from FIGS. 2 through 4, a lower clamper holding plate 30 which is driven horizontally with respect to the vertical direction by a driving means (not shown) is provided with a central cut-out area 30a. In addition, the holding plate 30 has a lower clamper carrying part 30b formed around the periphery of the central cut-out area 30a. Respective lower clamper members 31A and 31B are fastened by screws 32 to the lower clamper carrying part 30b so as to be on both sides of the central cut-out area 30a. Screw insertion holes 31a are opened in the lower clampers 31A and 31B, and these screw insertion holes 31 are formed as slots which extend in the direction parallel to the short sides 13b of the clamping area 13 of each lead part 12a formed on the tab tape 12. The lower clamper members 31A and 31B are formed symmetrically, and supporting plates 33A and 33B are fastened by screws 34 to the upper surfaces of the facing portions of the lower clamper members 31A and 31B so as to face the retaining parts 21b of the upper clamper members 21A and 21B. Furthermore, a guide plate 35 which is for guiding the lower clampers 31A and 31B is fastened by screws 36 to the lower clamper carrying part 30b so as to be located on one side of the lower clampers 31A and 31B.

More specifically, the pair of symmetric clamper members 31A and 31B make a lower clamper, and the supporting plates 33A and 33B of the clamper members 31A and 31B extend in the direction parallel to the long sides 13a (or perpendicular to the short sides 13b) of the clamping area 13 formed on the tab tape 12. Thus when this lower clamper of the present invention is compared to the prior art lower clamper, it can be said that the lower clamper of the present invention comprises two split parts that work together to clamp or hold a tab tape.

The supporting plates 33A and 33B support the tab tape 12 thereon, and it would be possible to form the lower clamper member 31A and supporting plate 33A, and the lower clamper member 31B and supporting plate 33B, as respective integral units. Furthermore, as shown in FIG. 1, driver holes 21c are formed in the upper clamper members 21A and 21B so as to positionally correspond to the screws 32 which fasten the lower clampers 31A and 31B to the lower clamper holding plate 30, so that the screws 32 can be tightened and loosened using these driver holes 21C.

With the structure described above, when the screws 22 are loosened, the upper clamper members 21A and 21B are movable towards and away from each other. Thus, the width between the facing surfaces of the upper clamper members 21A and 21B are changed or adjusted in the direction shown by the arrows A in FIG. 3 within the range of the lengths of the slots of the screw insertion holes 21a. In other words, the facing surfaces of the upper clamper members 21A and 21B can be set apart so as to match the short-side width of the clamping area 13 of the tab tape 12.

After this adjustment of the space between the upper clamper members 21A and 21B, the clamper members 21A and 21B are fastened to the upper clamper holding plate 20 by tightening the screws 22.

Likewise, when the screws 32 are loosened, the lower clamper members 31A and 31B are movable towards and away from each other. Thus, the width between the facing surfaces of the lower clamper members 31A and 31B is changed or adjusted in the direction indicated by the arrows B in FIG. 3 within a range defined by the lengths of the slots of the screw insertion holes 31a. In other words, the facing surfaces of the lower clampers 31A and 31B are adjusted so as to match the short-side width of the clamping area 13 of the tab tape 12.

After this adjustment of the space between the lower clamper members 31A and 31B, the clamper members 31A and 31B are fastened to the lower clamper holding plate 30 by tightening the screws 32.

When the adjustments described above are made, the upper clamper members 21A and 21B and lower clamper members 31A and 31B are moved along the respective guide plates 23 and 35; and the screws 22 and 32 are tightened with the upper clamper members 21A and 21B and lower clampers 31A and 31B pressed against the respective guide plates 25 and 35 after the width adjustment. Thus, the upper clamper members 21A and 21B and lower clamper members 31A and 31B are maintained in parallel positions.

The above embodiment is described with reference to a tape bonding apparatus in which a tab tape is clamped or held between upper and lower clampers. However, the present invention is applicable to die bonding apparatuses and wire bonding apparatuses which include heating blocks instead of the bonding stage 11 shown in FIG. 3. No lower clamper members 31A and 31B are involved in these bonding apparatuses. Accordingly, the upper clamper members 21A and 21B form the clamper mechanism, and lead frames are pressed against the heating block by this clamper mechanism. Thus, according to the present invention, the clamper members and the clamper holding plate of the die bonding apparatus and wire bonding apparatus are designed so that they have the same structure as the upper clamper members 21A and 21B and the upper clamper holding plate 20 of the tape bonding apparatus described above as seen from FIGS. 1 and 3.

As seen from the above, according to the present invention, upper and lower clampers are respectively divided into two parts on the short sides of lead patterns formed on a tab tape, and the two parts (clamper members) are respectively fastened to an upper clamper holding plate and a lower clamper holding plate so that the gaps between the facing surfaces of the two parts are adjustable.

Alternatively, when the present invention is applied to a die bonding apparatus or a wire bonding apparatus, a single clamper comprises a pair of clamper members or a clamper divided on the short sides of lead patterns formed on lead frames, and the thus made clamper is provided on a clamper holding plate so that the gap between the two clamper members of the clamper is adjustable.

Accordingly, when tab tapes and lead frames which have lead patterns with small short-side dimensions are bonded, there is no need to replace the clampers each time the type of product to be handled is changed. Thus, the required working time can be greatly shortened.

We claim:

1. A clamping mechanism for a bonding apparatus in which a tab tape is clamped from above and below by an upper clamper and a lower clamper, wherein said upper clamper and lower clamper are respectively split into two parts on short sides of lead patterns formed on said tab tape and are respectively fastened to an upper clamper holding plate and a lower clamper holding plate so that gaps between facing surfaces of respective parts of said clampers are adjustable.

2. A clamping mechanism for a die bonding apparatus or wire bonding apparatus in which lead frames are pressed against a heating block by a clamper, wherein said clamper is split into two parts on short sides of lead patterns formed on said lead frames and is fastened to a clamper holding plate so that a gap between facing surfaces of respective parts of said clamper is adjustable.

3. A clamping mechanism for a bonding apparatus in which a tab tape is held between an upper clamper and a lower clamper, wherein:

said upper clamper is comprised of a pair of clamping members provided on a clamper holder with a space in between, said pair of clamping members being movable towards and away from each other so that said space between said pair of clamping members is variable; and said lower clamper is comprised of a pair of clamping members provided on a clamper holder with a space in between, said pair of clamping members being movable towards and away from each other so that said space between said pair of clamping members is variable.

4. A clamping mechanism according to claim 3, wherein:

each of said pair of clamping members of said upper clamper is provided with a tab tape retaining section that extends in a direction parallel to long sides of a lead pattern formed on said tab tape; and each of said pair of clamping members of said lower clamper is provided with a tab tape supporting plate that extends in a direction parallel to said long sides of said lead pattern formed on said tab tape.

5. A clamping mechanism for a bonding apparatus in which a clamper presses a workpiece against a heating means of said bonding apparatus, wherein:

said clamper is comprised of a pair of clamping members provided on a clamper holder with a space in between, said pair of clamping members being movable towards and away from each other so that said space between said pair of clamping members can be changed.

* * * * *